US011018060B2

(12) United States Patent
Kang et al.

(10) Patent No.: US 11,018,060 B2
(45) Date of Patent: May 25, 2021

(54) SEMICONDUCTOR DEVICE HAVING DEEP TRENCH STRUCTURE AND METHOD OF MANUFACTURING THEREOF

(71) Applicant: KEY FOUNDRY CO., LTD., Cheongju-si (KR)

(72) Inventors: Yang Beom Kang, Cheongju-si (KR); Kang Sup Shin, Cheongju-si (KR)

(73) Assignee: KEY FOUNDRY CO., LTD., Cheongju-si (KR)

( * ) Notice: Subject to any disclaimer, the term of this patent is extended or adjusted under 35 U.S.C. 154(b) by 0 days.

(21) Appl. No.: 16/560,147

(22) Filed: Sep. 4, 2019

(65) Prior Publication Data

US 2020/0343145 A1    Oct. 29, 2020

(30) Foreign Application Priority Data

Apr. 26, 2019   (KR) .................. 10-2019-0049272

(51) Int. Cl.
*H01L 21/8234* (2006.01)
*H01L 29/78* (2006.01)
(Continued)

(52) U.S. Cl.
CPC ............... *H01L 21/823481* (2013.01); *H01L 21/02129* (2013.01); *H01L 21/26513* (2013.01);
(Continued)

(58) Field of Classification Search
CPC ......... H01L 21/823481; H01L 29/7816; H01L 29/0638; H01L 29/0649; H01L 29/1095;
(Continued)

(56) References Cited

U.S. PATENT DOCUMENTS 7,968,418 B1   6/2011   Labonte et al.
8,357,989 B2   1/2013   Oishi et al.
(Continued)

FOREIGN PATENT DOCUMENTS

JP    2015-138853 A    7/2015
KR    10-2011-0000923 A   1/2011
(Continued)

OTHER PUBLICATIONS

Korean Office Action dated Apr. 21, 2020 in corresponding Korean Patent Application No. 10-2019-0049272 (5 pages in Korean).
(Continued)

*Primary Examiner* — Steven H Loke
*Assistant Examiner* — Juanita B Rhodes
(74) *Attorney, Agent, or Firm* — NSIP Law

(57) ABSTRACT

A semiconductor device includes etch stop films formed on the first gate electrode, the first source region, the first drain region, and the shallow trench isolation regions, respectively. First interlayer insulating films are formed on the etch stop film, respectively. Deep trenches are formed in the substrate between adjacent ones of the first interlayer insulating films to overlap the shallow trench isolation regions. Sidewall insulating films are formed in the deep trenches, respectively. A gap-fill insulating film is formed on the sidewall insulating film. A second interlayer insulating film is formed on the gap-fill insulating film. A top surface of the second interlayer insulating film is substantially planar and a bottom surface of the second interlayer insulating film is undulating.

7 Claims, 15 Drawing Sheets

(51) Int. Cl.
*H01L 29/06* (2006.01)
*H01L 29/10* (2006.01)
*H01L 21/3105* (2006.01)
*H01L 21/02* (2006.01)
*H01L 21/764* (2006.01)
*H01L 21/762* (2006.01)
*H01L 21/8236* (2006.01)
*H01L 29/66* (2006.01)
*H01L 29/45* (2006.01)
*H01L 27/088* (2006.01)
*H01L 21/285* (2006.01)
*H01L 21/265* (2006.01)

(52) U.S. Cl.
CPC .. *H01L 21/28518* (2013.01); *H01L 21/31055* (2013.01); *H01L 21/764* (2013.01); *H01L 21/76237* (2013.01); *H01L 21/8236* (2013.01); *H01L 21/823493* (2013.01); *H01L 27/0883* (2013.01); *H01L 29/0638* (2013.01); *H01L 29/0649* (2013.01); *H01L 29/1083* (2013.01); *H01L 29/1095* (2013.01); *H01L 29/45* (2013.01); *H01L 29/66681* (2013.01); *H01L 29/7816* (2013.01)

(58) Field of Classification Search
CPC ........... H01L 29/1083; H01L 21/28518; H01L 21/26513; H01L 21/31055; H01L 21/02129; H01L 21/764; H01L 21/76237; H01L 21/823493; H01L 21/8236; H01L 29/66681; H01L 29/45; H01L 27/0883; H01L 29/665; H01L 29/0653; H01L 29/66689; H01L 29/7833; H01L 29/6659; H01L 27/088; H01L 21/823418
See application file for complete search history.

(56) References Cited

U.S. PATENT DOCUMENTS

| | | | |
|---|---|---|---|
| 8,569,138 B2 | 10/2013 | Lee et al. | |
| 8,569,839 B2 | 10/2013 | Morii et al. | |
| 8,786,016 B2 | 7/2014 | Jang | |
| 9,263,320 B2 | 2/2016 | Murata et al. | |
| 9,922,865 B2 | 3/2018 | Lee et al. | |
| 10,109,626 B2 | 10/2018 | Shinohara | |
| 10,115,720 B2 | 10/2018 | Kim et al. | |
| 2014/0008705 A1 | 1/2014 | Choi et al. | |
| 2014/0124857 A1 | 5/2014 | Jang | |
| 2014/0291767 A1* | 10/2014 | Lee ................... H01L 29/66659 257/368 |
| 2015/0206787 A1* | 7/2015 | Murata ................. H01L 21/764 438/422 |
| 2017/0301668 A1 | 10/2017 | Kim et al. | |
| 2017/0301669 A1* | 10/2017 | Shinohara ............. H01L 21/764 |

FOREIGN PATENT DOCUMENTS

| | | |
|---|---|---|
| KR | 10-2013-0078035 A | 7/2013 |
| KR | 10-2014-0006370 A | 1/2014 |
| KR | 10-2014-0057993 A | 5/2014 |
| KR | 10-2014-0119954 A | 10/2014 |
| KR | 10-1780147 B1 | 9/2017 |

OTHER PUBLICATIONS

Korean Office Action dated Dec. 21, 2020 in counterpart Korean Patent Application No. 10-2019-0049272 (5 pages in Korean).

* cited by examiner

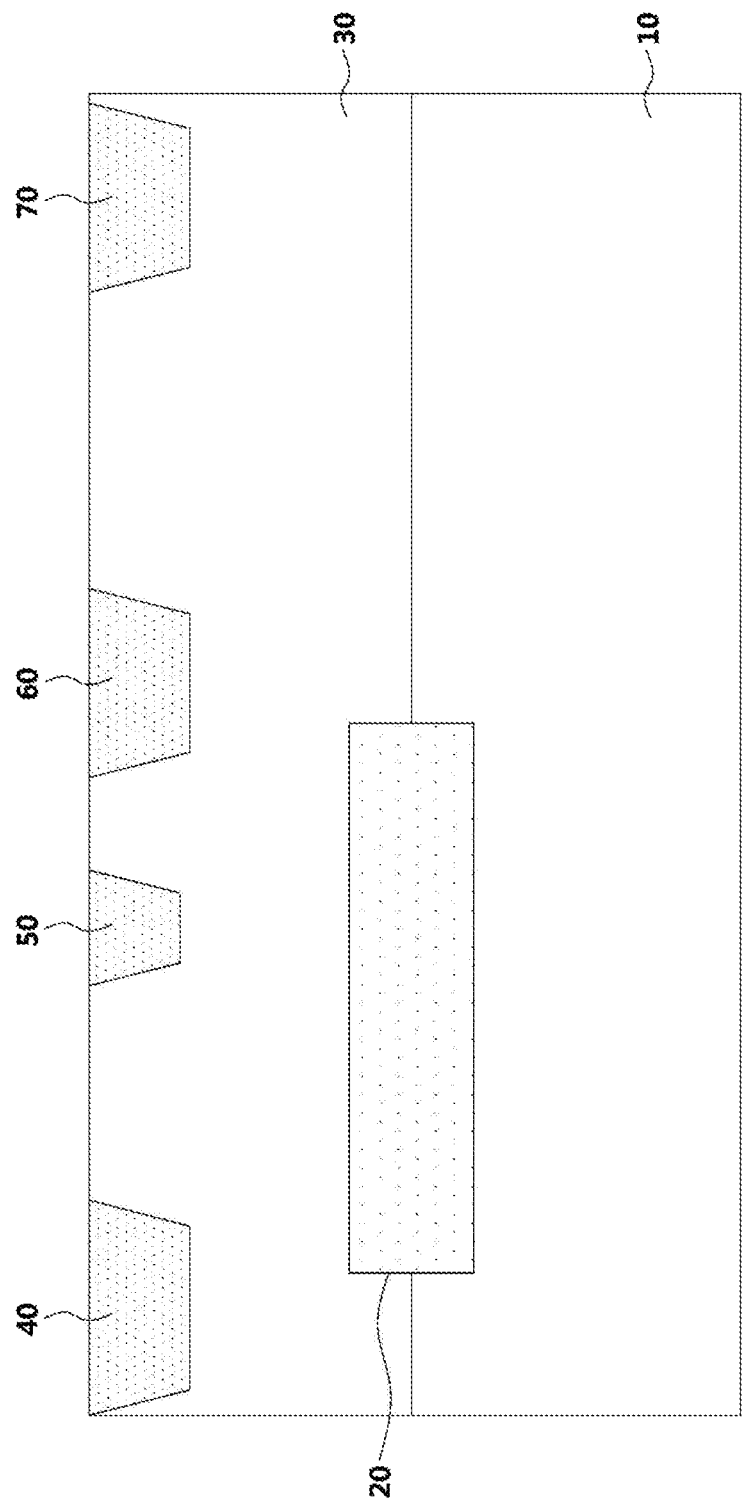

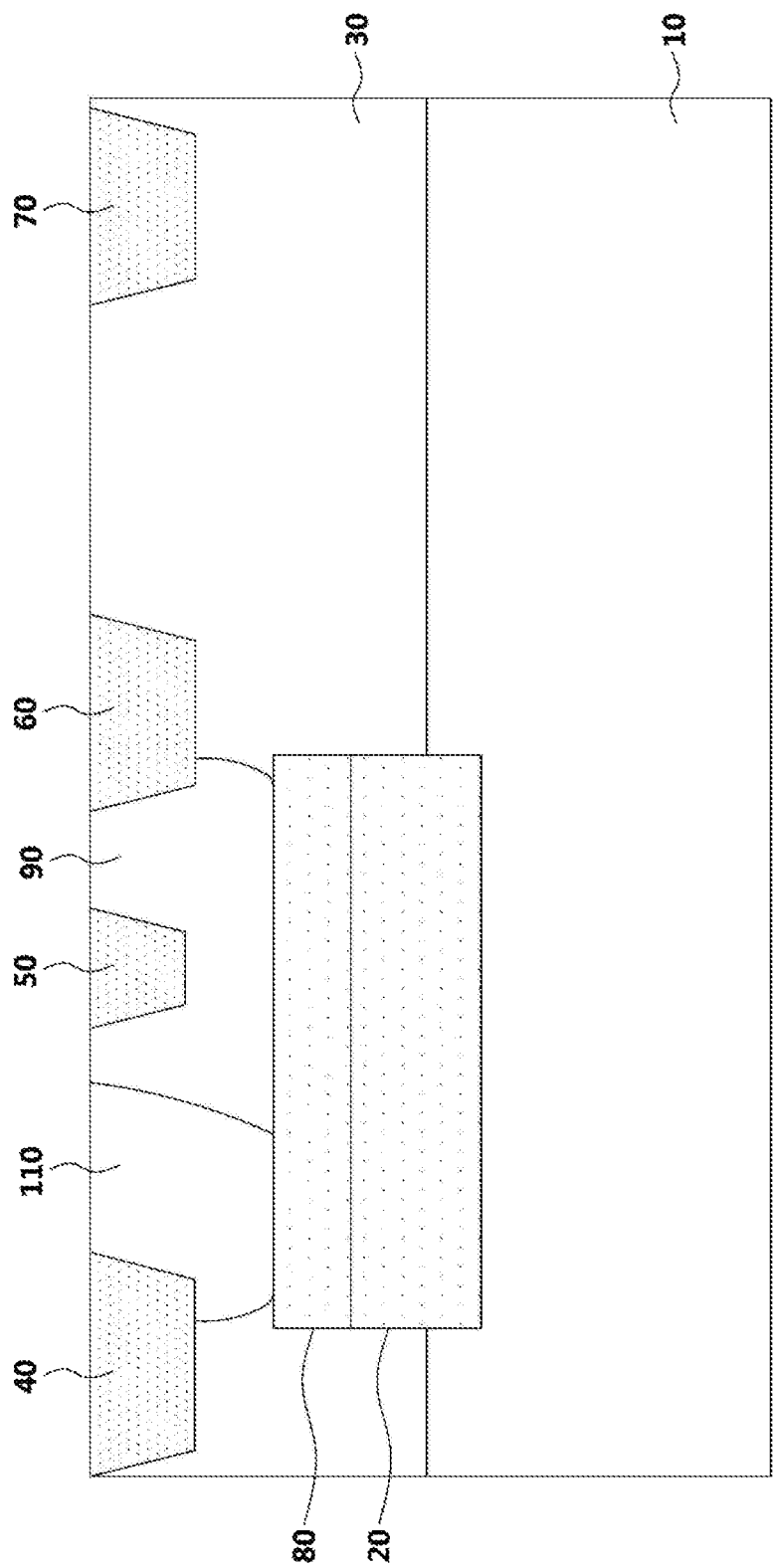

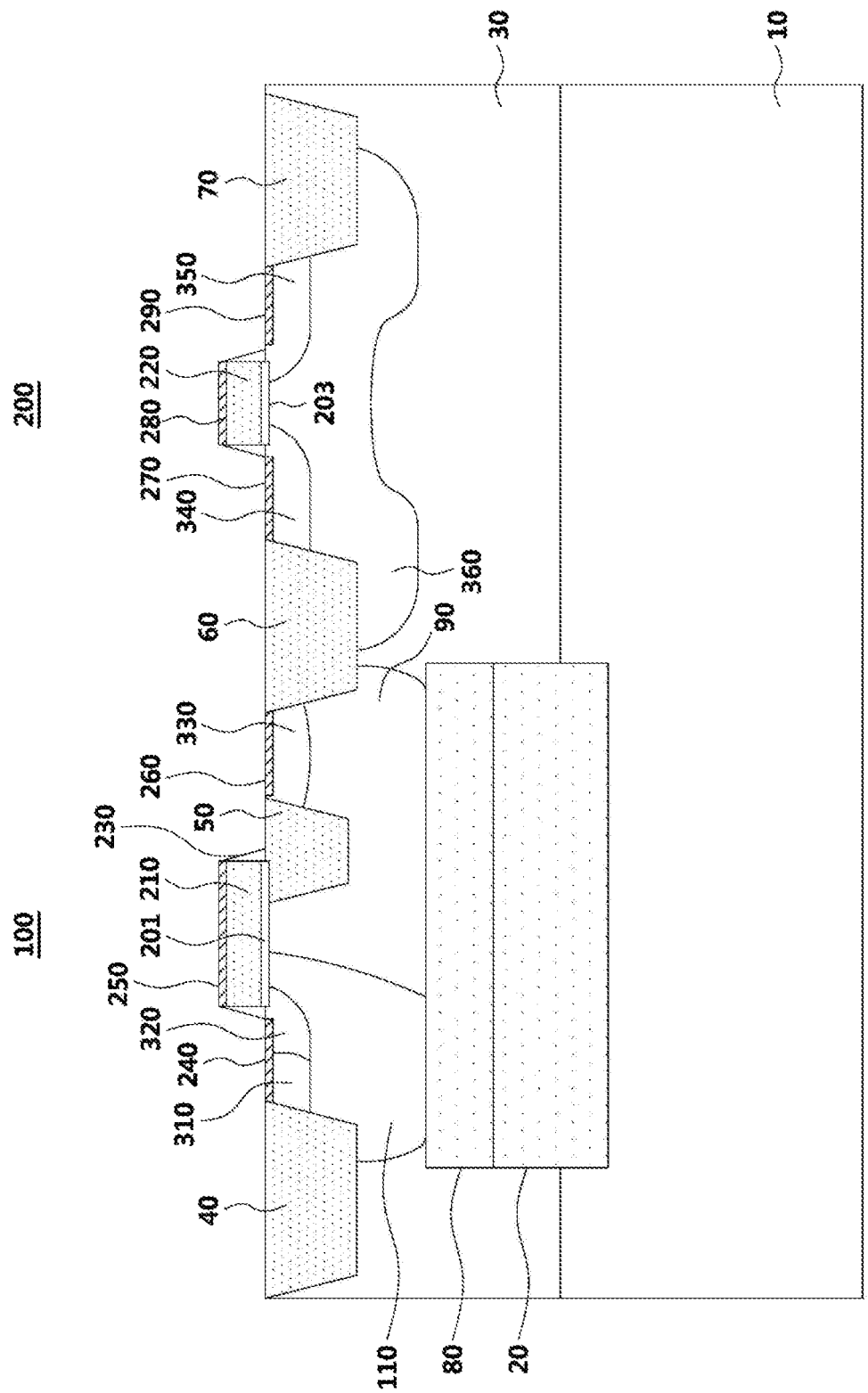
[FIG. 3]

[FIG. 4]
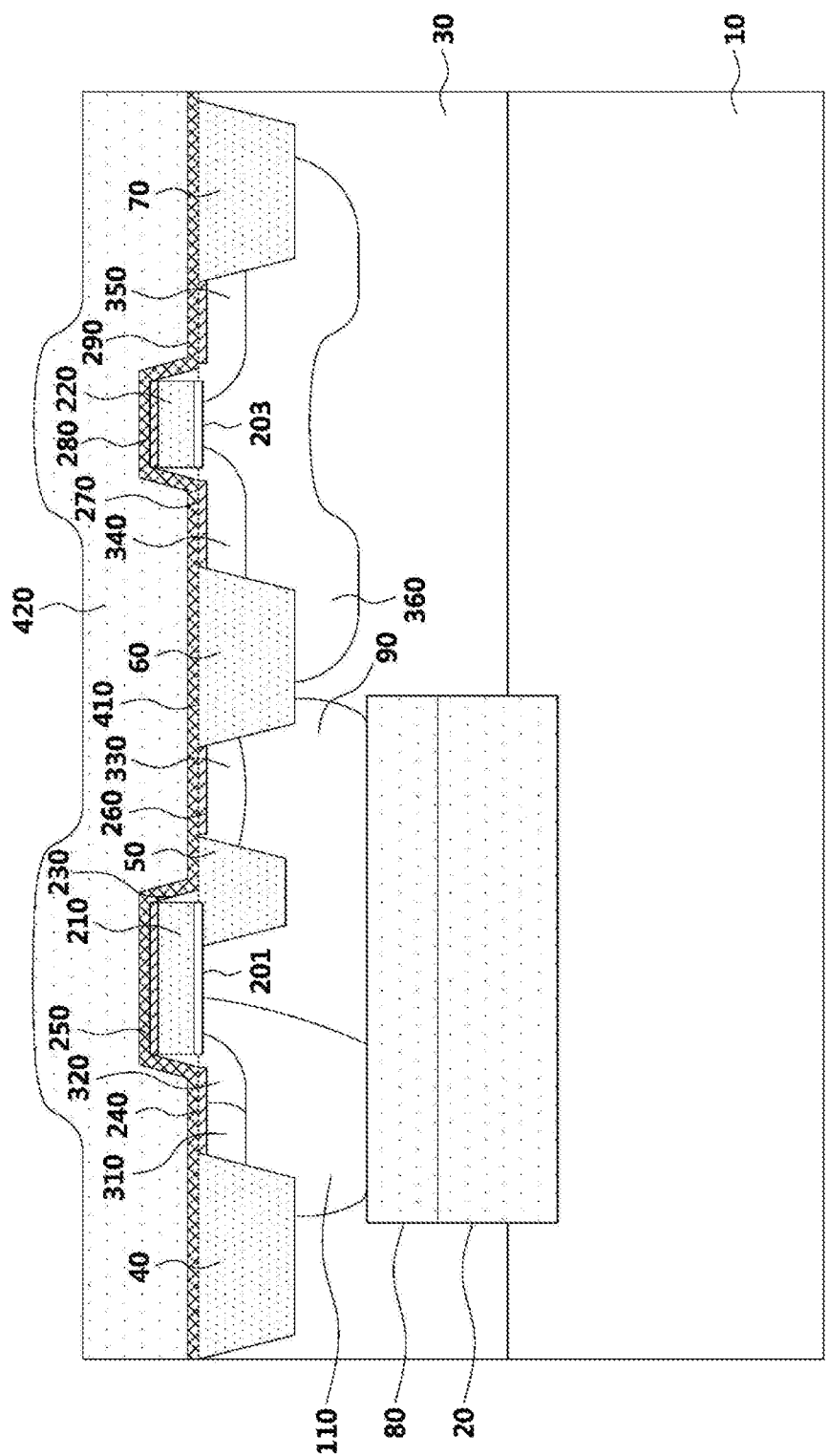

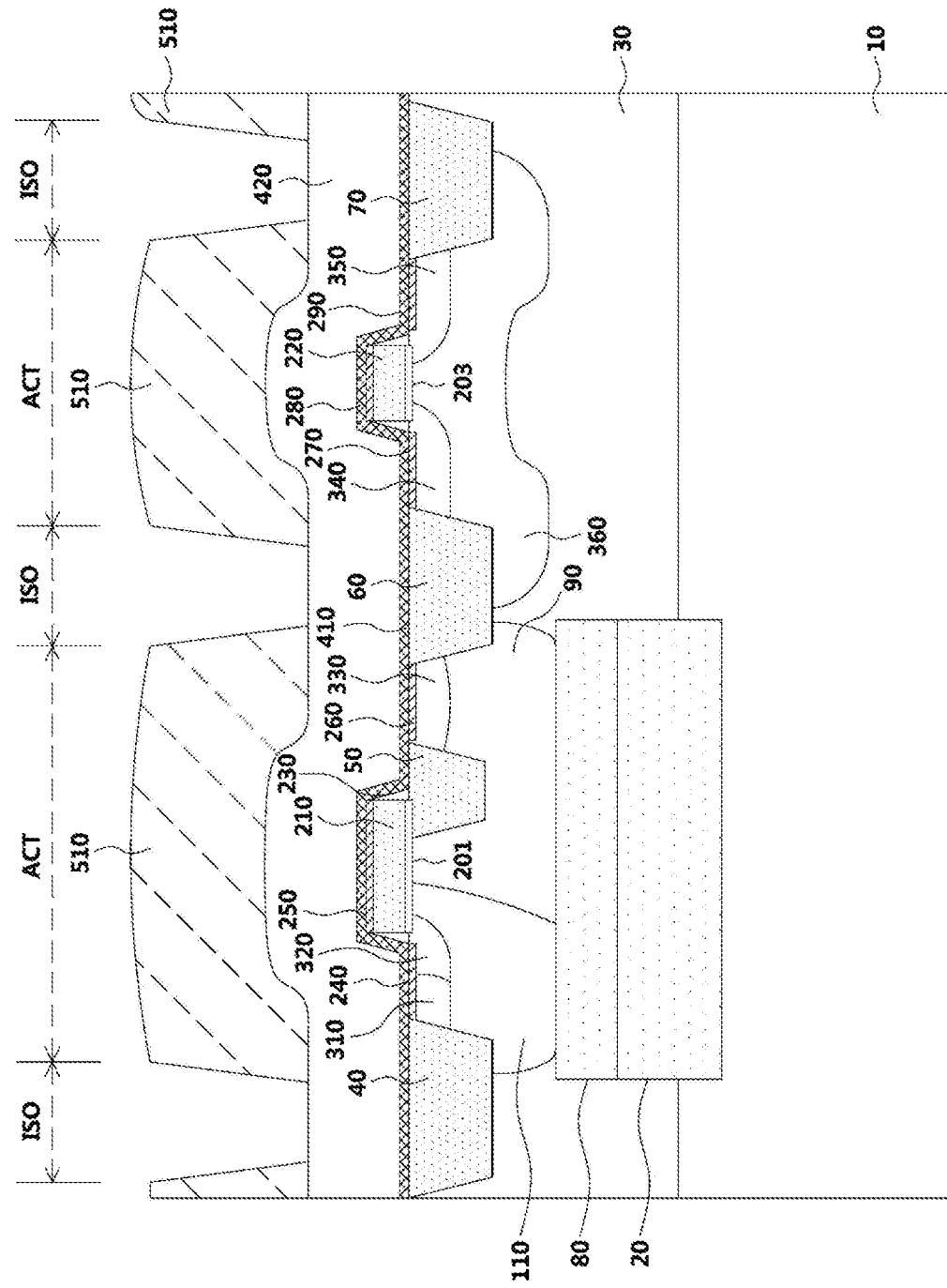
[FIG. 5]

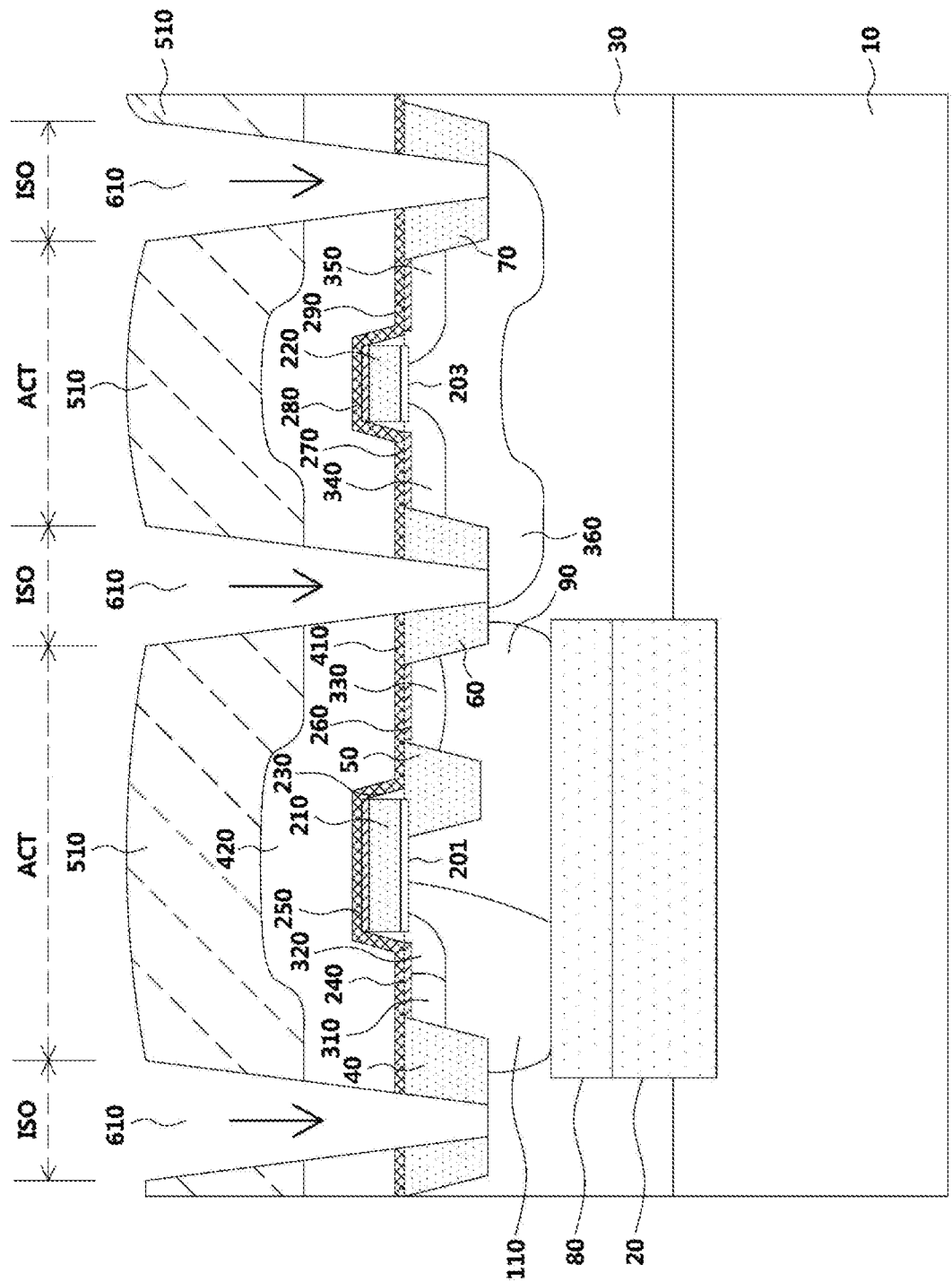

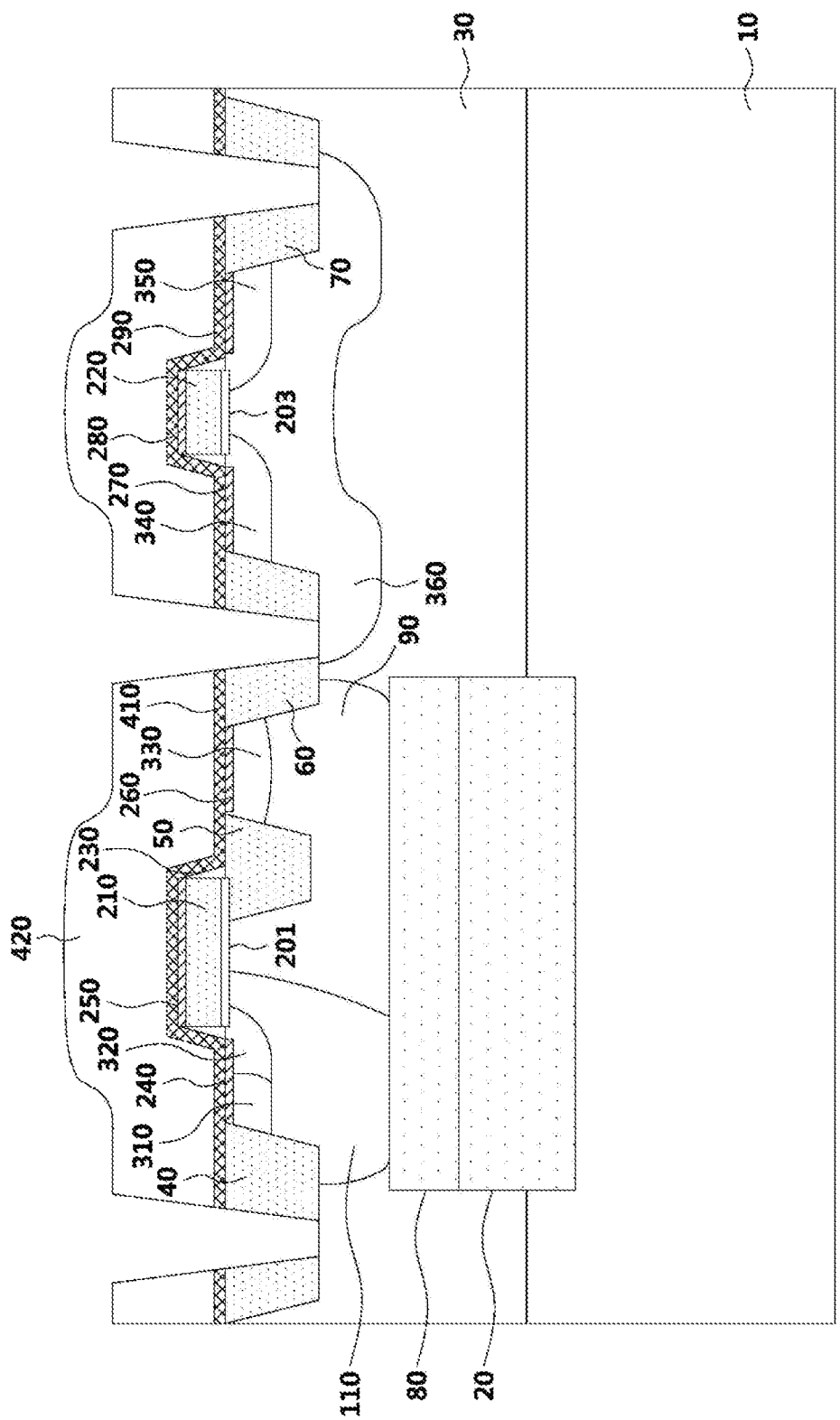
[FIG. 7]

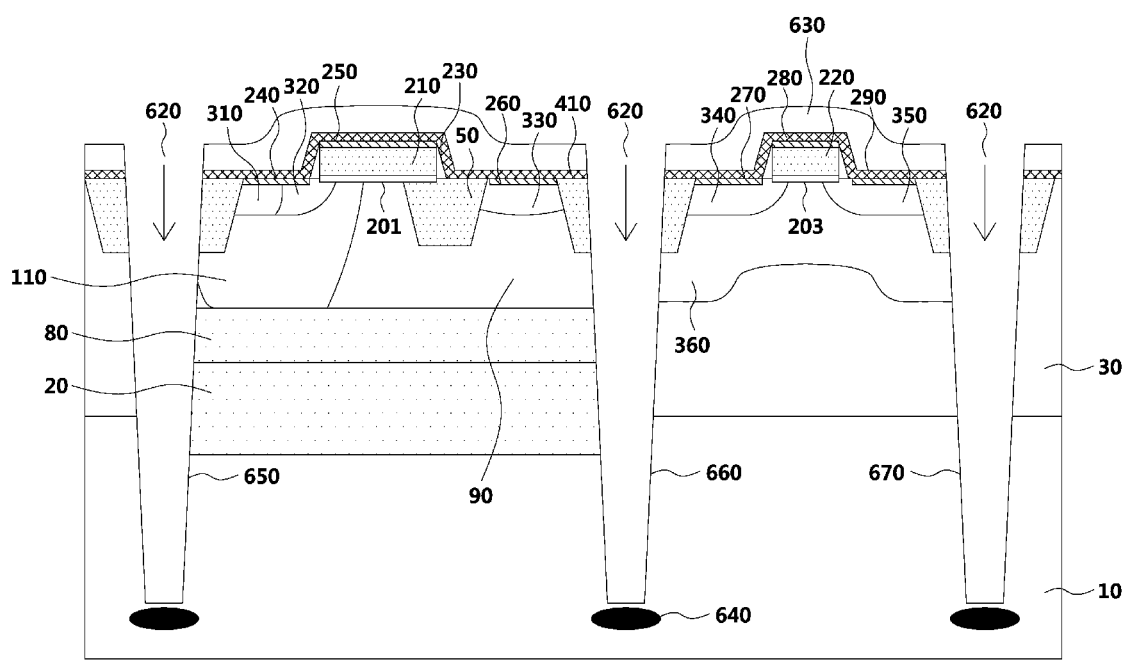
[FIG. 8]

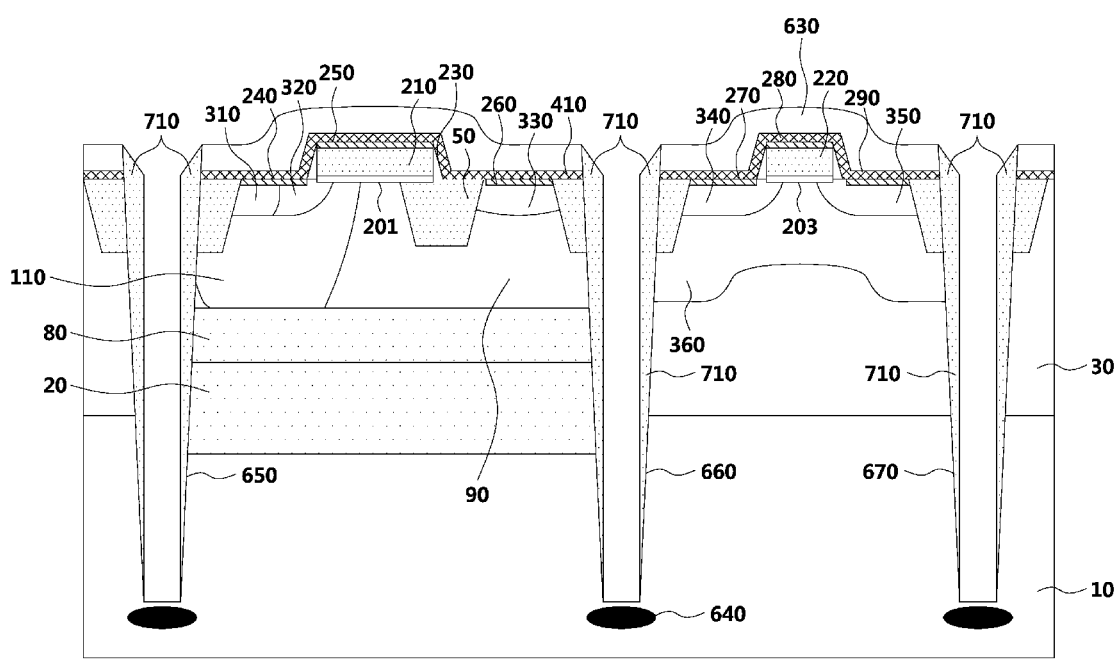
[FIG. 9]

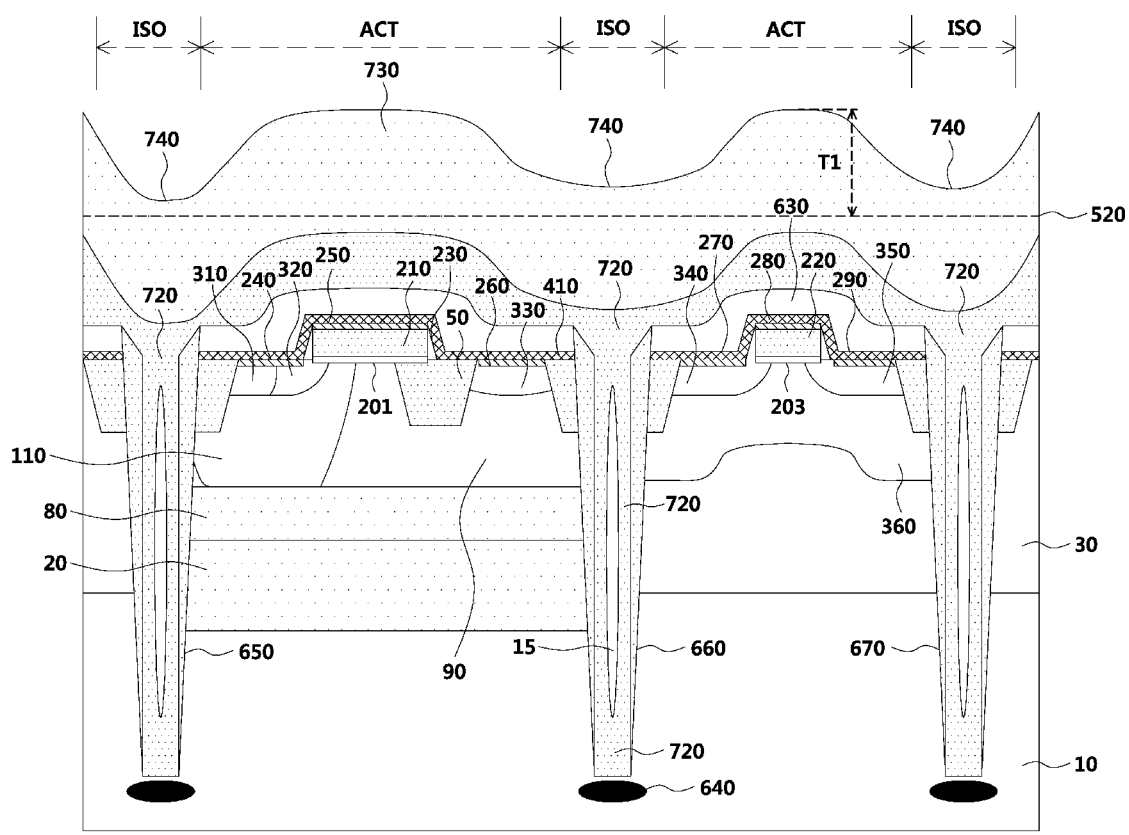
【FIG. 10】

[FIG. 11]
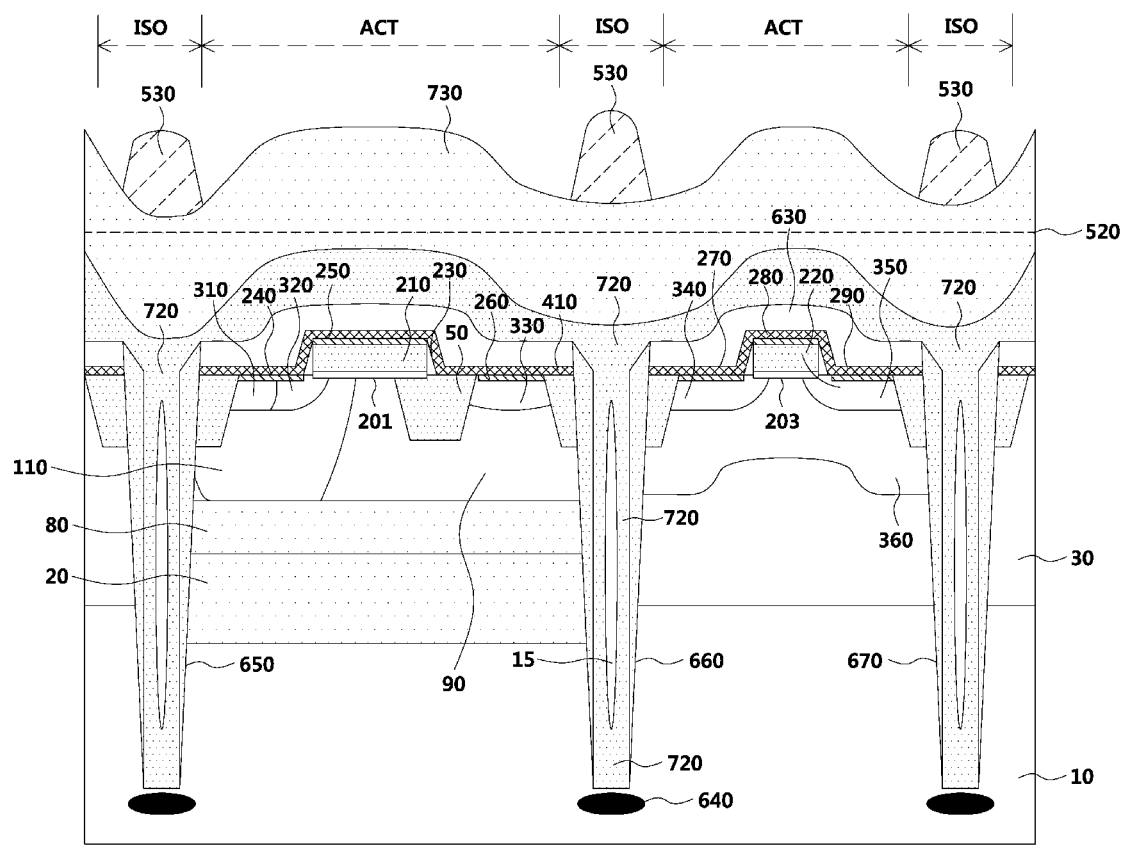

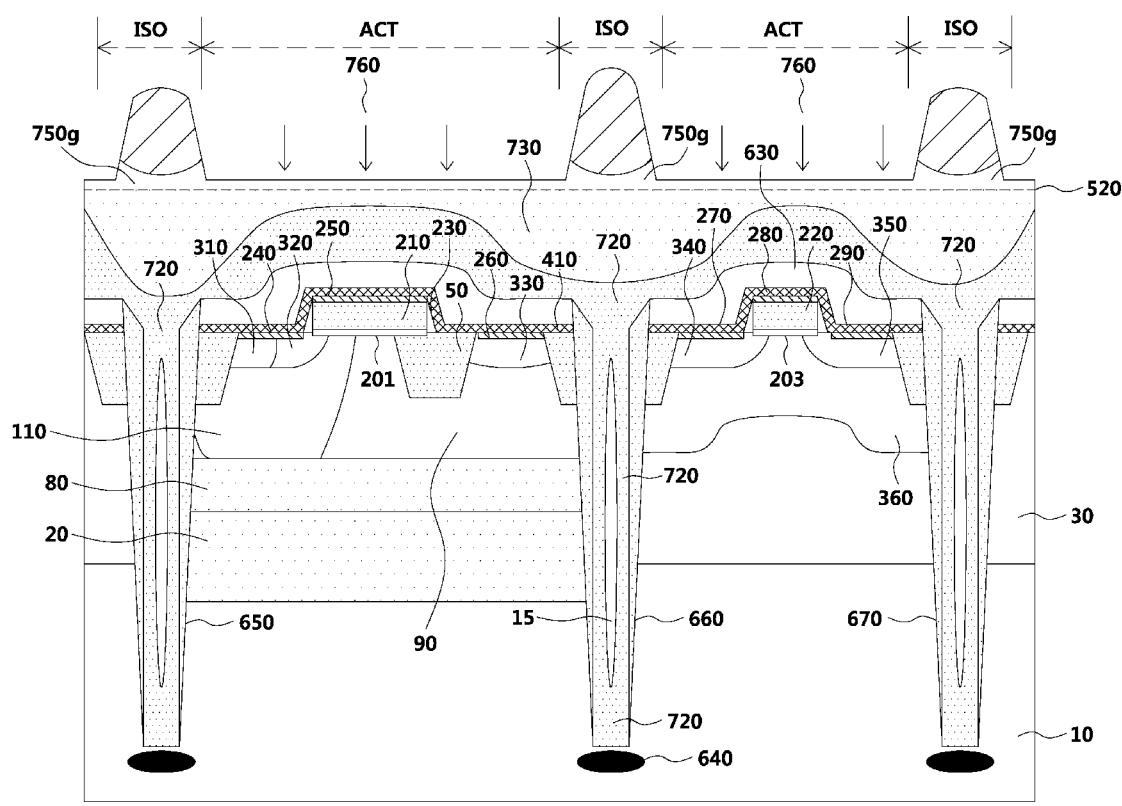
[FIG. 12]

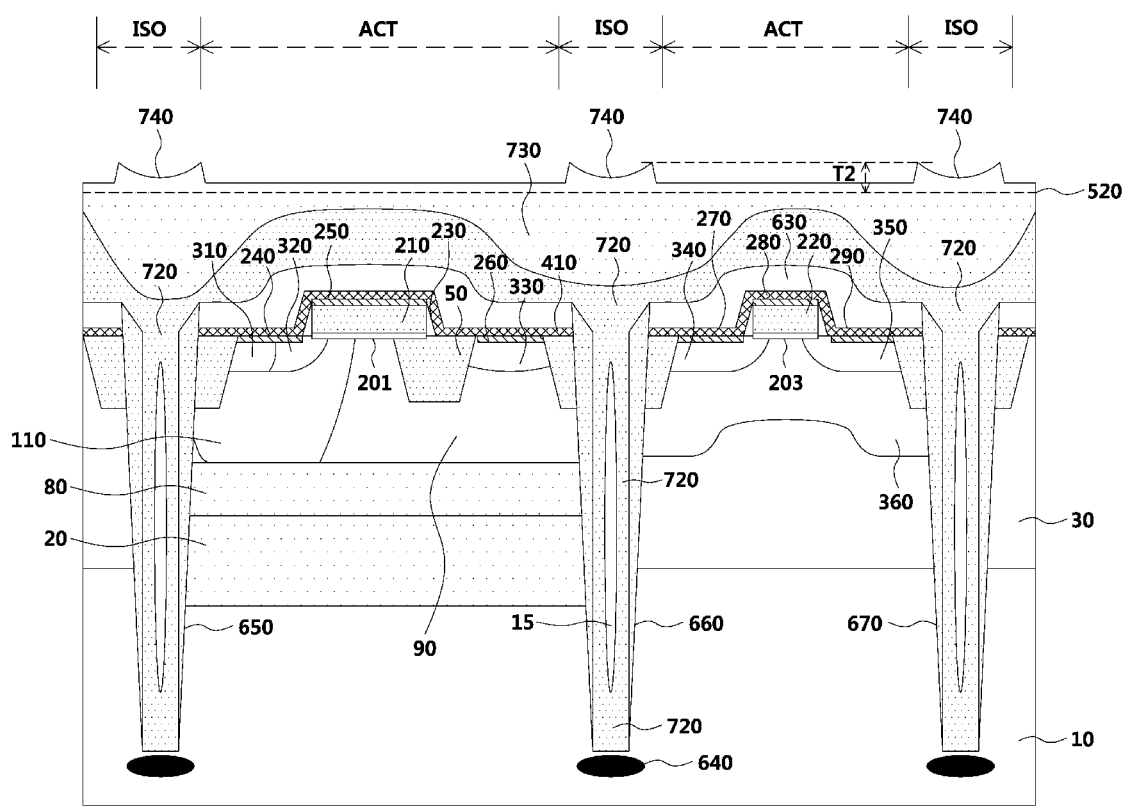
【FIG. 13】

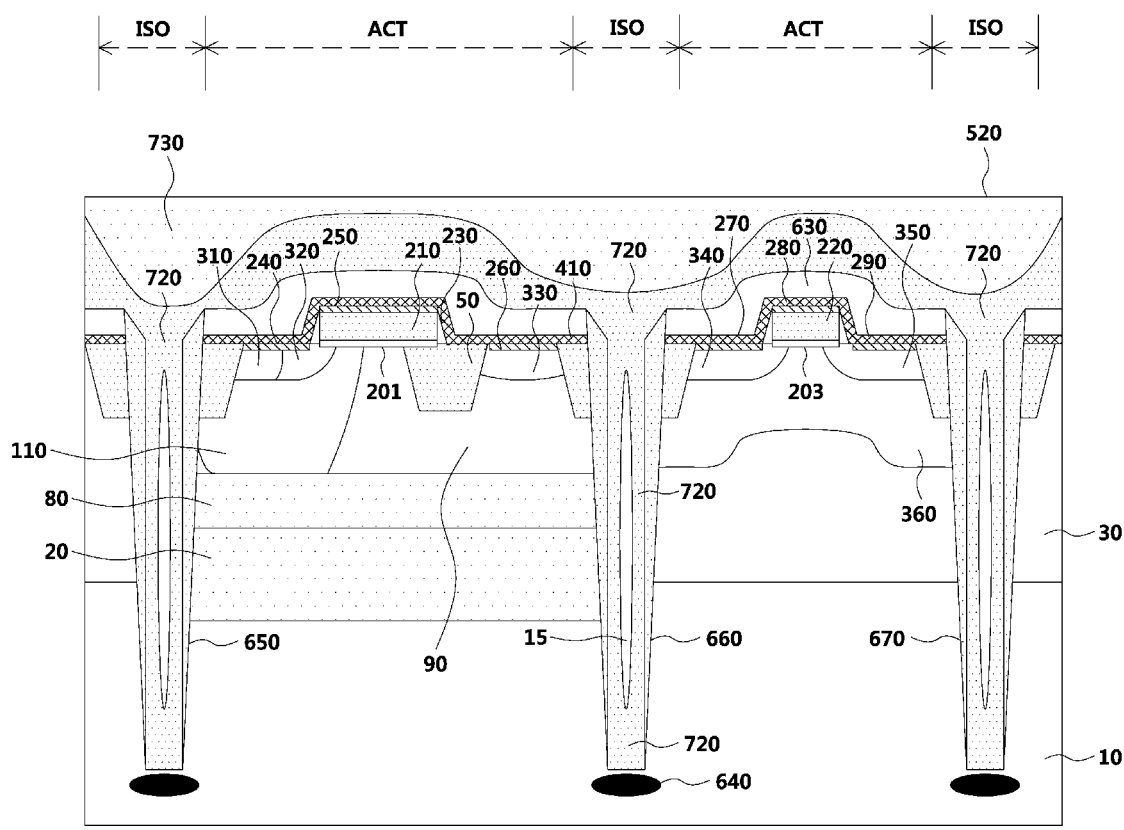
[FIG. 14]

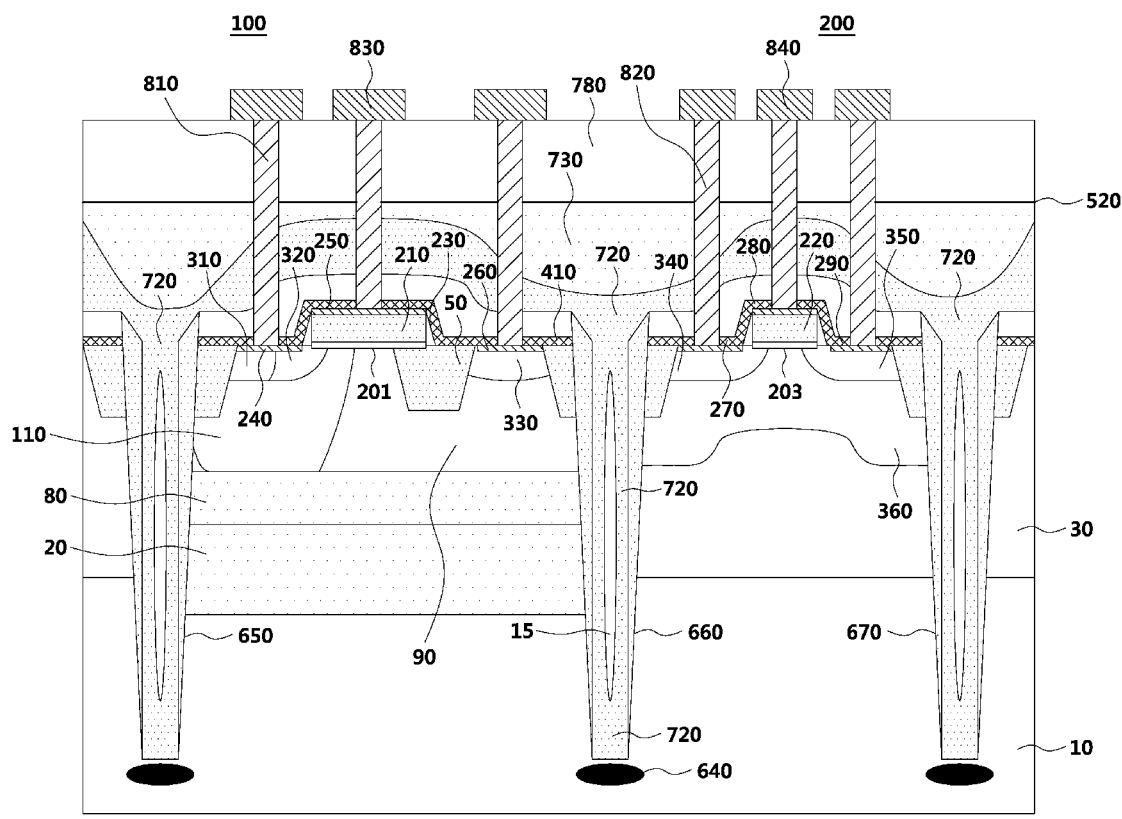
[FIG. 15]

SEMICONDUCTOR DEVICE HAVING DEEP TRENCH STRUCTURE AND METHOD OF MANUFACTURING THEREOF

CROSS-REFERENCE TO RELATED APPLICATION

This application claims the benefit under 35 U.S.C. 119(a) of Korean Patent Application No. 10-2019-0049272 filed on Apr. 26, 2019 in the Korean Intellectual Property Office, the entire disclosure of which is incorporated herein by reference for all purposes.

BACKGROUND

1. Field

The following description relates to a semiconductor device having a deep trench structure and a method of manufacturing the same.

2. Description of Related Art

A shallow trench isolation (STI) structure and deep trench isolation (DTI) structure may be used to isolate various semiconductor devices in a chip. In the case of using DTI structure rather than STI structure, current leakage between neighboring devices and latch-up caused by overcurrent may be prevented. Therefore, the DTI structure is widely used for its characteristics suitable for a smaller chip size and better performance of the device.

However, it is difficult to fill a DTI structure with an insulating film because of its relatively deep depth of about 10-20 µm. For this reason, the method of depositing an insulating film is repeated several times; however, the repetition may result in the surface of the insulating film becoming uneven after the gap-fill. That is, the thickness of an insulating film in DTI structure is substantially relatively smaller than the thickness of the insulating film stacked in a region without DTI structure, with respect to the substrate surface. A severe "dishing" phenomenon occurs where grooves are generated on the surface of the insulating film when a DTI structure is filled with an insulating film.

When a very thick insulating film is further deposited, the thickness of the insulating film to be removed by a chemical mechanical polishing (CMP) process greatly increases, which may increase the irregularity of the thickness on the wafer. The increase in the irregularity of thickness causes a problem when forming a contact hole. That is, when a wafer is divided into a central region and an edge region, the thickness of the insulating film remaining in the edge region may be relatively greater than the thickness of the insulating film remaining in the central region.

A thickness greater than the target thickness may remain at the wafer edge. A normal contact etch process is performed on the center region of the wafer, and the surface of the substrate is exposed normally.

However, near the edge region, a contact open failure may occur when the insulating film is not properly etched by a contact etching process. When a contact open failure occurs, a contact is not formed between the metal wiring and an action region of the substrate, which may result in an inoperative device.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of manufacturing a semiconductor device, includes: forming shallow trench isolation regions on a substrate; forming a first gate electrode, a first source region, and a first drain region between the shallow trench isolation regions; forming an etch stop film on a surface of the substrate; depositing a first interlayer insulating film on the etch stop film; forming first photoresist patterns on the first interlayer insulating film; etching the first interlayer insulating film exposed between adjacent ones of the first photoresist patterns and the etch stop film to expose the substrate; removing the first photoresist patterns; etching the exposed substrate using the first interlayer insulating film as a mask to form a deep trench; depositing a sidewall insulating film on sidewalls of the deep trench; depositing a gap-fill insulating film on the sidewall insulating film; depositing a second interlayer insulating film on the gap-fill insulating film; forming second photoresist patterns on portions of the second interlayer insulating film overlapping the deep trench; performing etch-back processing on the second interlayer insulating film region between adjacent ones of the second photoresist patterns; removing the second photoresist patterns; performing chemical mechanical polishing (CMP) processing on the second interlayer insulating film to form a planarized second interlayer insulating film; depositing a third interlayer insulating film on the planarized second interlayer insulating film; forming a contact plug connected to the first source region or the first drain region; and forming a metal wiring connected to the contact plug.

The gap-fill insulating film and the second interlayer insulating film may include a borophosphosilicate glass (BPSG) film.

The contact plug may be formed by etching the etch stop film, the first, second, and third interlayer insulating films.

The first interlayer insulating film may have an uneven surface. A top surface of the planarized second interlayer insulating film may be smoother than a surface of the first interlayer insulating film.

The method may further include forming a first buried layer in a first region of the substrate; and forming a second buried layer, a drift region, and a body region on the first buried layer. One of the shallow trench isolation regions may overlap the gate electrode.

The method may further include forming a second gate electrode in the substrate; performing ion implantation using the second gate electrode to form a well region in the substrate; and forming a second source region and a second drain region in the well region. A depth of the well region below the second gate electrode may be shallower than depths below the second source and drain regions.

An ion implantation process may be performed after the forming the deep trench to form a channel stop layer.

In another general aspect, a semiconductor device includes a first gate electrode, a first source region, and a first drain region formed between shallow trench isolation regions, an etch stop film, an interlayer insulating film, a contact plug, a metal wiring, a deep trench, a sidewall insulating film, and a gap-fill insulating film. The shallow trench isolation regions are formed on a substrate. The etch stop film is formed on the first gate electrode, the first source region, the first drain region, and the shallow trench isolation regions. The interlayer insulating film is formed on the etch stop film. The contact plug is formed in the interlayer insulating film. The metal wiring is formed in contact with the contact plug. The deep trench is formed to overlap one of the shallow trench isolation regions and formed in contact with the etch stop film. The sidewall insulating film is formed in the deep trench. The gap-fill insulating film is formed on the sidewall insulating film.

The interlayer insulating film may include a plurality of interlayer insulating films.

A first interlayer insulating film of the plurality of interlayer insulating films may be formed on the etch stop film.

A second interlayer insulating film of the plurality of interlayer insulating films may be deposited on the gap-fill insulating film.

A surface of the first interlayer insulating film may be uneven, and a surface of the second interlayer insulating film may be smoother than the surface of the first interlayer insulating film.

The shallow trench isolation regions and the etch stop film may be in contact with each other.

The semiconductor device may further include a drift region and a body region in the substrate. The first source region may be formed in the body region, and the first drain region may be formed in the drift region.

The semiconductor device may further include a well region in the substrate, and a second gate electrode, a second source region, and a second drain region formed on the well region. A depth of the well region below the second gate electrode may be shallower than depths below the second source region and the second drain region.

In another general aspect, a semiconductor device includes a first gate electrode, a first source region, and a first drain region formed between adjacent shallow trench isolation regions formed on a substrate, etch stop films, first interlayer insulating films, deep trenches, sidewall insulating films, gap-fill insulating film, and a second interlayer. The etch stop films are formed on the first gate electrode, the first source region, the first drain region, and the shallow trench isolation regions, respectively. The first interlayer insulating films are formed on the etch stop film, respectively. The deep trenches are formed in the substrate between adjacent ones of the first interlayer insulating films to overlap the shallow trench isolation regions. The sidewall insulating films are formed in the deep trenches, respectively. The gap-fill insulating film is formed on the sidewall insulating film. The second interlayer insulating film is formed on the gap-fill insulating film. A top surface of the second interlayer insulating film is substantially planar and a bottom surface of the second interlayer insulating film is undulating.

The semiconductor device may further include contact plugs formed through respective ones of the first interlayer insulating films and the second interlayer insulating film, and metal wirings formed in contact with the contact plugs, respectively.

The shallow trench isolation regions and the etch stop film may be in contact with each other.

The semiconductor device may further include a drift region and a body region formed in the substrate. The first source region may be formed in the body region, and the first drain region may be formed in the drift region.

The semiconductor device may further include a well region in the substrate, and a second gate electrode, a second source region, and a second drain region formed on the well region,
wherein a depth of the well region below the second gate electrode is shallower than depths below the second source region and the second drain region.

Other features and aspects will be apparent from the following detailed description, the drawings, and the claims.

BRIEF DESCRIPTION OF THE DRAWINGS

FIG. 1 is a cross-sectional view of an example of a silicon substrate after forming a first buried layer on the silicon substrate.

FIG. 2 is a cross-sectional view of an example of the silicon substrate after forming a drift region and a second buried layer in an epitaxial layer.

FIG. 3 is a cross-sectional view of an example of the silicon substrate after forming a high-voltage-operating device and a low-voltage-operating device on the silicon substrate.

FIG. 4 is a cross-sectional view of an example of the silicon substrate after forming an ESL (Etch Stop Layer) and a first interlayer insulating film (hard mask layer) on the entire surface of the silicon substrate.

FIG. 5 is a cross-sectional view of an example of the silicon substrate after forming a first photoresist pattern on the first interlayer insulating film.

FIG. 6 is a cross-sectional view of an example of the silicon substrate after etching the hard mask layer and the ESL.

FIG. 7 is a cross-sectional view of an example of the silicon substrate after removing the first photoresist pattern.

FIG. 8 is a cross-sectional view of an example of the silicon substrate after forming a deep trench isolation (DTI) on the silicon substrate FIG. 9 is a cross-sectional view of an example of the silicon substrate after depositing a sidewall insulating film to form a deep trench insulating film.

FIG. 10 is a cross-sectional view of an example of the silicon substrate after a gap-fill process.

FIG. 11 is a cross-sectional view of an example of the silicon substrate after forming a second photoresist pattern on a second interlayer insulating film.

FIG. 12 is a cross-sectional view of an example of the silicon substrate after an etching back process of the second interlayer insulating film.

FIG. 13 is a cross-sectional view of an example of the silicon substrate after removing the second photoresist pattern.

FIG. 14 is a cross-sectional view of an example of the silicon substrate after performing a chemical mechanical polishing (CMP) process to the second interlayer insulating film.

FIG. 15 is a cross-sectional view of an example of the silicon substrate after depositing a third interlayer insulating film.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

The following description disclosure relates to a semiconductor device in which grooves generated during a gap-fill process using an interlayer insulating film are removed by an etch-back and a chemical mechanical polishing (CMP) process, thereby obtaining an interlayer insulating film of uniform thickness and a method of manufacturing the same.

The following description further relates to a method of forming a deep trench insulating film in a semiconductor substrate, and more particularly, to a method for removing grooves generated while forming a deep trench insulating film. And a method for obtaining an interlayer insulating film having a uniform thickness by performing an etch-back process and a CMP process to an interlayer insulating film in which grooves are generated. Thus, preventing a subsequent contact failure that may occur.

An embodiment of the present disclosure relates to a semiconductor device having a uniform interlayer insulating film thickness by removing grooves through an etch-back process and a CMP process. The grooves are generated when a deep trench insulating film is formed on a semiconductor substrate by using an interlayer insulating film. According to such a method of manufacturing a semiconductor device, a "dishing" phenomenon of the interlayer insulating film which may be generated while forming a deep trench isolation (DTI) structure may be mitigated.

The following description also provides a method of manufacturing a semiconductor device in which a contact failure does not occur between a metal wiring and a substrate.

The features of the examples described herein may be combined in various ways as will be apparent after an understanding of the disclosure of this application. Further, although the examples described herein have a variety of configurations, other configurations are possible as will be apparent after an understanding of the disclosure of this application.

A manufacturing process of a semiconductor device in the following description of the present disclosure will be described with reference to FIG. 1. An N-type first buried layer (or NBL, 20) is formed on a P-type or an N-type silicon substrate 10. The NBL 20 may be used to electrically isolate a high-voltage-operating device from the substrate or may be used with a deep trench isolation (DTI) structure in order to substantially isolate the adjacent devices from each other.

An N-type or a P-type epi-layer 30 is formed on the NBL 20 and the substrate 10. A shallow trench isolation (hereinafter referred to as a shallow trench insulating film, 40 to 70) is formed on the surface of the epi layer 30. Reduced surface field (RESURF) shallow trench isolation (STI) 50 may be used for lowering the surface electric field of the high-voltage-operating device. The remaining STI insulating films 40, 60, and 70 may be used as device isolation films.

In FIG. 2, a P-type second buried layer 80 may be formed on the epi layer 30 and the NBL 20, in the same high voltage region, using a mask pattern. An N-type drift region 90 may be formed using the same mask pattern. Also, a P-type body region 110 is formed. The N-type drift region 90 and the P-type body region 110 are formed to have depths deeper than the depths of the STI insulating films 40 to 70, and are formed in contact with the second buried layer 80.

In FIG. 3, a first and second gate insulating films 201 and 203 are formed on the substrate in the high-voltage region 100 and a low-voltage region 200, respectively. Here, the thickness of the first gate insulating film 201 used for the high-voltage-operating device 100 may be thicker than the thickness of the second gate insulating film 203 used for the low-voltage-operating device 200. Also, first and second gate electrodes 210 and 220 are formed in the high-voltage region 100 and the low-voltage region 200, respectively.

An N-type well region (or NW) or a P-type well region (or PW, 360) is formed on a substrate located under the gate electrode, for example, the second gate electrode 220. The NW and PW may be formed by ion implantation using the gate electrode as a mask. A plurality of masks are typically required to manufacture semiconductor devices, increasing manufacturing cost. Thus, when NW and PW are formed after forming the gate electrode as described above, the number of masks may be reduced. NM, PM, NLDD and PLDD regions may be formed by using the gate electrode as a mask for the NW and the PW. The depth of the well region below the gate electrode is less than the depth of the well region below the source region or drain region. This is because the gate electrode is used as a mask for the NM, PM, NLDD, and PLDD implantations. Then, spacers 230 are formed on the sidewalls of the gate electrode, respectively. A first pickup region 310, a first source region 320, a first drain region 330, a second source region 340 and a second drain region 350 are formed on the substrate.

Further, silicide layers 240 to 290 are formed on the substrate and the gate electrode, for example, the first and second gate electrodes 210 and 220. Thus, the high-voltage-operating device 100 is formed. Here, the silicide layers 240 to 290 are formed of TiSi2 or CoSi2 or NiSi.

A BCD device such as nEDMOS and nLDMOS may be used as the high-voltage-operating device 100. Further, devices requiring high operation voltages such as 40V, 60V, 80V, and 100V may be used. A low-voltage-operating device 200 or a logic device having an operating voltage of 1 to 5V may be used beside the high-voltage-operating device 100.

FIG. 4 illustrates an example of the silicon substrate after forming an etch stop film or an etch stop layer (ESL) 410 on the entire surface of the substrate 10. Etch stop layer (ESL) 410 is deposited on the first and second gate electrodes 210 and 220, the silicide layers 240 to 290, and the STI surface using silicon nitride film (SiN) or silicon oxynitride film (SiON) material. The etch stop layer (ESL) 410 may be used for a borderless contact. The borderless contact may be provided to shrink reduced chip size. In an example, the contact hole may be formed on both the active region and isolation region as the pitch is reduced. A field insulating film may be outside the active region. For example, a region having STI or DTI insulating film may be a field insulating film. When the contact hole is formed on an STI region, the STI insulating film may be deeply etched when the etch stop film is absent. The silicide layer may be formed subsequently up to an undesired region. An etch stop layer 410 from the present embodiment may be desired to prevent it.

A first interlayer insulating film 420 is deposited on the etch stop layer 410. The first interlayer insulating film 420 may be used as a hard mask layer to form deep trench isolation (DTI). A silicon oxide film (SiO2), a silicon nitride film (SiN), and a silicon oxynitride film (SiON) may be used as the hard mask layer. An oxide film (LPCVD TEOS) deposited by low pressure chemical vapor deposition (LPCVD) using TEOS (Tetra Ethyl Ortho Silicate) precursor material may be used. Alternatively, an APCVD USG (Undoped Silica Glass) film or an oxide film deposited using a PECVD method (PECVD TEOS) may be used.

In FIG. 5, a patterned photoresist (PR) pattern 510 is formed on the top surface of the hard mask layer 420 to form a DTI structure. A photoresist pattern 510 is formed using a DTI mask. Here, a first photoresist pattern (PR pattern) 510 is formed to open an isolation (ISO) region of the first interlayer insulating film 420 overlapping the region where the deep trench is to be formed. The remaining region (active (ACT) region) leaves the PR pattern. The height of the hard mask layer 420 in the ISO region is lower than that of the hard mask layer 420 in the ACT region of a top surface of the substrate. The PR pattern 510 remains in the ACT region.

In FIG. 6, the hard mask layer 420 and the ESL 410 may be etched by an etching process 610 using the first photoresist pattern 510 as a mask.

The STI insulating films 40-70 may be further etched by etching the center portions of the STI insulating films 40 to 70. The silicon epi-layer 30 may become partially exposed due to excessive etching. Through the etching process 610, the STI insulating films 40, 60, and 70 are partially removed.

In FIG. 7, the first photoresist pattern 510 may be removed by using a dry etching process followed by a wet chemical cleaning process.

In FIG. 8, a first, a second, and a third DTI 650 to 670 are formed by etching the substrate using a hard mask layer (first interlayer insulating film) 420. Here, DTI structures 650 to 670 overlap STI structures 40 to 70. This may reduce the size of the chip because the chip size may increase when an STI structure and a DTI structure are formed separately.

Ion implantation 620 is performed to form a channel stop implantation layer 640 on the lower surface of DTI structure, for further ensuring the isolation between the devices, and for blocking leakage of current. The depth of DTI may be about 10-20 μm, in a non-limiting example. After DTI structures 650 to 670 are formed, a sidewall oxide film (not shown) may be formed by a thermal process. A liner nitride film (not shown) may be formed on the surface oxide film. A sidewall oxide film or liner nitride film is to reduce the stress of DTI structure.

The initial hard mask layer (first interlayer insulating film) 420 is partly etched while forming DTI structure. Although, the hard mask layer (first interlayer insulating film) 630 having a small thickness remains, the gate electrode, the silicide layer, the source region, and the drain region may be protected by the remaining first interlayer insulating film 420.

Since the DTI structures 650 to 670 are formed through the etch stop layer 410, the DTI structure and the etch stop layer 410 are in contact with each other.

In FIG. 9, a sidewall insulating film 710 is deposited to form a deep trench insulating film after the deep trenches 650 to 670 are formed. The sidewall insulating film may prevent diffusion of elements such as B and P to the substrate from the BPSG film, which may be deposited thereafter.

In the present example, the sidewall insulating film 710 is deposited by a PECVD (Plasma Enhanced Chemical Vapor Deposition) method but may also be deposited by an LPCVD method.

When the sidewall insulating film 710 is formed, top corner portions of the deep trenches 650 to 670 are formed with more sidewall insulating film 710 than the middle or bottom portion of the deep trenches, which results in narrowing the opening at the top corner of the deep trenches. A subsequent deposition process of the sidewall insulating film 710 creates voids 15, as shown in FIG. 10, inside the deep trenches, when filled through the opening. For a subsequent deposition process, a repeated deposition and etch-back processes are performed during the deposition of the sidewall insulating film 710. As a result, the sidewall insulating film 710 may be deposited more on upper parts of the deep trenches than lower parts of the deep trenches.

FIG. 10 shows a gap-fill process, which may result in voids or air gaps being formed inside one or more of the deep trenches 650 to 670. The air gap 15 itself may act as an insulator. The air gap 15, as well as the deep trench structure, are formed in a horizontal direction parallel to a top surface of the silicon substrate 10 and may effectively isolate a formed transistor from another transistor. In an example, the gap-fill process may be performed by depositing a gap-fill insulating film 720 on the sidewall insulating film and using an etch-back process. A borophosphosilicate glass (BPSG) film having excellent flow characteristics may be used for the gap-fill insulating film 720 as it may be easier to fill deep trenches with a BPSG film than with other materials.

In this example, the opening to the DTI may be blocked with the gap-fill insulating film 720. This process may be used in forming an air gap 15 inside the silicon substrate 10 by blocking the openings of the deep trenches 650 to 670. Further, a gap-fill insulating film 720 may be deposited to a meet a specific thickness along the surface of the sidewall insulating film 710 formed in the deep trench. The air gap 15 is formed in the silicon substrate 10 during the gap-fill process.

In this embodiment, while the air gap 15 is formed inside the silicon substrate 10, the air gap 15 may not necessarily be formed in other examples. For example, the inside of the deep trench 650 to 670 may be substantially filled with an insulating material or conductive material, such as polysilicon material for conductive material.

A second interlayer insulating film 730 having a greater thickness than the gap-fill insulating film 720 may deposited on the gap-fill insulating film 720. The second interlayer insulating film 730 may be the same or a different material as the gap-fill insulating film 720. The second interlayer insulating film 730 may be BPSG. In this example, the same material as the gap-fill insulating film 720 is used for the second interlayer insulating film 730. When the gap-fill insulating film 720 and the second interlayer insulating film 730 are the same material, the attachment between oxide films may improve, which may reduce the peeling of the thin film during a CMP process. When BPSG material is deposited to have a predetermined thickness resulting in forming the grooves 740, location of the grooves 740 may correspond to the upper part of the deep trenches 650 to 670. As the deep trench structures are formed, the groove structures are formed on the deep trench structures after deposition of the insulating layer on the substrate.

The dashed line 520 is a target point of the second interlayer insulating film 730 which is removed by a CMP process. In other words, the dashed line 520 is an END point where all the grooves 740 may be removed. If the grooves 740 are not substantially removed, it may result in problems during the photolithography process. Thus, it may be desirable for the grooves 740 to be removed. The thickness T1 is the minimum target thickness to be removed by a CMP process.

The greater the thickness T1, the greater the thickness that is to be removed by a CMP process. The step height or elevation of the second interlayer insulating film 730 may be considerable due to the grooves 740. The second interlayer insulating film 730 and the grooves 740 are formed of "ACT" and "ISO" regions. The ACT region of the undulating surface of the insulating film has a greater insulating film thickness than the ISO region where the grooves 740 are formed. That is, the step height between the "ACT" region and "ISO" region of the undulating insulating film surface is pronounced. In such a case, a CMP process time may be required to substantially remove the grooves as the presence of the grooves may result in a photo defect. Therefore, an etch-back process may be used as the next etching process before performing a CMP process. The etch-back process may be used to etch the thick region (T1 region).

FIG. 11, a second photoresist pattern 530 may be formed on the second interlayer insulating film 730 using a reverse DTI mask, which may reduce the amount of interlayer insulating material that is to be removed by a CMP process.

A reverse DTI mask for forming the second photoresist pattern 530 may be related to the DTI mask used in the first photoresist pattern 510 (see FIG. 5) for forming the DTI previously. That is, a reverse DTI mask for forming the second photoresist pattern 530 may be easily produced by reversing the DTI mask.

For example, in a DTI mask, that the ISO region of the DTI mask may be open and not covered by a PR pattern, and the ACT region may be covered by the PR pattern. On the contrary, in the reverse DTI mask, the ISO region is covered by a PR pattern, and the ACT is opened. Here, the term "opened" refers to a region where the PR pattern is removed by exposure. The opening region is a region where the insulating film is etched by etching gas. If the PR pattern is covered, it is not etched.

As illustrated in FIG. 11, the ACT region is open, and the ISO region is covered with PR pattern. Thus, the ACT region is etched, and the ISO region is not etched. Here, the ISO region is a blocked region where the grooves or the concave grooves are formed. Also, the portion is blocked with the second photoresist pattern 530.

In FIG. 12, a part of the second interlayer insulating film may be etched by the etch-back process 760 using the second photoresist pattern 530 as a mask. Before performing a CMP process, a part of the second interlayer insulating film 730, excluding the mountain-shaped insulating film 750g, may be dry-etched in advance.

The overall thickness of the second interlayer insulating film 730 is reduced by this etch-back process. The second interlayer insulating film may be removed during the etch-back process before the planarization process (CMP); therefore, the thickness of the insulating film to be removed by a CMP process is reduced. The process of removing the second interlayer insulating film may improve the uniformity of the thickness of the second interlayer insulating film after a CMP process. The etch-back 760 may reduce the difference in the height of the entire insulating film.

In FIG. 13, the second photoresist pattern 530 is removed. The second interlayer insulating film 730, including a mountain-shaped insulating film or protrusion 750g is exposed on the top of the DTI after removing the second photoresist pattern 530. The upper surface of the mountain-shaped insulating film 750g includes concave grooves 740 or grooves 740 that may be removed, as much as the thickness T2, by a CMP process. Here, in the "ACT" region, the thickness which is to be removed by a CMP process is smaller than T2. Also, in comparison with FIG. 10, the thickness which is to be removed by a CMP process is T2 and not T1. The difference between T1 and T2 is removed by the etch-back process. The amount of the interlayer insulating film to be removed during a CMP process may be remarkably reduced.

Comparing FIGS. 10 and 13 in the following description, the CMP process may end up removing a much smaller thickness T2 than the thickness T1. If a part of the second interlayer insulating film 730 is etched in a previous step before a CMP process, the amount of the interlayer insulating film which is substantially removed in a CMP process may be reduced. As a result, the frequency and the time for a CMP process may be reduced. Therefore, the uniformity of the thickness of the insulating film remaining on the wafer increases according to a CMP process.

FIG. 14 illustrates a cross-sectional view after performing the planarization process (CMP) of the second interlayer insulating film to form a planarized second interlayer insulating film 730.

The remaining mountain-like insulating film 750g (see FIG. 13) is removed by a CMP process; thus, obtaining the surface 520 of the planarized interlayer insulating film 730. In this example, in the "ACT" region, the thickness to be removed by a CMP process is relatively smaller. Thus, the uniformity of the thickness of the remaining second interlayer insulating film 730 may increase. Accordingly, the contact open failure in the contact photolithography process may be disappear.

In FIG. 15, a third interlayer insulating film 780 is deposited on the second interlayer insulating film 730. The film of the third interlayer insulating film 780 may be a material different from the material of the second interlayer insulating film 730. If a BPSG oxide film is the material for the second interlayer insulating film 730, the third interlayer insulating film 780 may be of an un-doped silicon oxide film formed using a TEOS precursor. The third interlayer insulating film 780 may be an oxide film having a higher density of the second interlayer insulating film 730. When the density of the third interlayer insulating film 780 is higher, it may allow for an easier deposition and etching of the metal wiring in subsequent processes.

A plurality of contact plugs 810 and 820 are formed in the third interlayer insulating film 780 and the second interlayer insulating film 730. The first metal layers 830 and 840 are formed connected to the contact plugs 810 and 820. A third interlayer insulating film may be further deposited, first or second Vias formed, and second or third metal layers formed (not illustrated).

According to the embodiments of the present disclosure described above, examples of the present disclosure relates to a method of forming a deep trench insulating film in a semiconductor substrate, and a method for removing the grooves which are generated while forming a deep trench insulating film. By performing an etch-back process and a CMP process on an interlayer insulating film in which the grooves are generated, in an example, an interlayer insulating film may be formed to have a uniform thickness. Thus, subsequent contact failure may be prevented.

According to the method of manufacturing a semiconductor device of the present disclosure as described in the above examples, an interlayer insulating film having a uniform thickness may be obtained by performing an etch-back and a CMP process to remove the grooves generated while forming a deep trench insulating film, which may prevent open contact failure and also improve yield.

The following detailed description is provided to assist the reader in understanding the methods, apparatuses, and/or systems described herein. However, the present disclosure is not limited to the above embodiments, and various changes, modifications, and equivalents of the methods, apparatuses, and/or systems described herein may be made after an understanding of the disclosure of this application. For example, the sequences of operations described here are merely embodiments, and may be limited to those set forth here, certain order. Also, descriptions of features that are known in the art may be omitted for clarity and conciseness.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of manufacturing a semiconductor device, the method comprising:
    forming shallow trench isolation regions on a substrate;
    forming a first gate electrode, a first source region, and a first drain region between the shallow trench isolation regions;
    forming an etch stop film on a surface of the substrate;
    depositing a first interlayer insulating film on the etch stop film;
    forming first photoresist patterns on the first interlayer insulating film;
    etching the first interlayer insulating film exposed between adjacent ones of the first photoresist patterns and the etch stop film to expose the substrate;
    removing the first photoresist patterns;
    etching the exposed substrate using the first interlayer insulating film as a mask to form a plurality of deep trenches;
    depositing a sidewall insulating film on sidewalls of the deep trench;
    depositing a gap-fill insulating film on the sidewall insulating film;
    depositing a second interlayer insulating film on the gap-fill insulating film;
    forming second photoresist patterns on portions of the second interlayer insulating film overlapping the plurality of deep trenches;
    performing etch-back processing on the second interlayer insulating film region between adjacent ones of the second photoresist patterns;
    removing the second photoresist patterns;
    performing chemical mechanical polishing (CMP) processing on the second interlayer insulating film to form a planarized second interlayer insulating film;
    depositing a third interlayer insulating film on the planarized second interlayer insulating film;
    forming a contact plug connected to the first source region or the first drain region; and
    forming a metal wiring connected to the contact plug.

2. The method of claim 1, wherein the gap-fill insulating film and the second interlayer insulating film comprise a borophosphosilicate glass (BPSG) film.

3. The method of claim 1, wherein the contact plug is formed by etching the etch stop film, the first, second, and third interlayer insulating films.

4. The method of claim 1, wherein the first interlayer insulating film has an uneven surface, and wherein a top surface of the planarized second interlayer insulating film is smoother than a surface of the first interlayer insulating film.

5. The method of claim 1 further comprising:
forming a first buried layer in a first region of the substrate; and
forming a second buried layer, a drift region, and a body region on the first buried layer,
wherein one of the shallow trench isolation regions overlaps the first gate electrode.

6. The method of claim 1 further comprising:
forming a second gate electrode in the substrate;
performing ion implantation using the second gate electrode to form a well region in the substrate; and
forming a second source region and a second drain region in the well region,
wherein a depth of the well region under the second gate electrode is smaller than a depth of the well region under the second source region or the second drain region.

7. The method of claim 1, wherein an ion implantation process is performed after the forming the plurality of deep trenches to form a channel stop layer.

* * * * *